(12) United States Patent
Krugmann et al.

(10) Patent No.: US 9,735,086 B2
(45) Date of Patent: Aug. 15, 2017

(54) POWER SEMICONDUCTOR MODULE HAVING A TWO-PART HOUSING

(71) Applicant: Infineon Technologies AG, Neubiberg (DE)

(72) Inventors: Jens Krugmann, Paderborn (DE); Christoph Messelke, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/259,496

(22) Filed: Sep. 8, 2016

(65) Prior Publication Data

US 2017/0069561 A1    Mar. 9, 2017

(30) Foreign Application Priority Data

Sep. 9, 2015   (DE) .................. 10 2015 115 122

(51) Int. Cl.
H01L 23/10   (2006.01)
H01L 23/34   (2006.01)
(Continued)

(52) U.S. Cl.
CPC ...... H01L 23/3735 (2013.01); H01L 23/4006 (2013.01); *H01L 2023/4087* (2013.01);
(Continued)

(58) Field of Classification Search
CPC ......... H01L 23/10; H01L 23/34; H01L 21/52; H01L 23/3575; H01L 23/4006; H01L 25/072; H01L 23/367
(Continued)

(56) References Cited

U.S. PATENT DOCUMENTS 6,787,900 B2 *  9/2004  Shinohara ............... H01L 23/13
                                                          257/675
7,494,389 B1 *  2/2009  Essert ............... H01L 23/49861
                                                          257/692
(Continued)

FOREIGN PATENT DOCUMENTS

DE         10149886 A1    4/2003
DE         10326176 A1    1/2005
DE      102004051039 A1    5/2006

*Primary Examiner* — S. V. Clark
(74) *Attorney, Agent, or Firm* — Murphy, Bilak & Homiller, PLLC

(57) ABSTRACT

A power semiconductor module includes a substrate having a first side for being arranged to face a heat sink and for being thermally conductively connected to the heat sink, a power semiconductor component arranged on an opposing second side of the substrate, and an electrically insulating housing defining a cavity in which the substrate and the power semiconductor component are accommodated. The housing includes a frame which surrounds the substrate in a frame-like manner, and a hood for being fastened to the heat sink by way of fastening means. The hood includes a pressing die for making contact with the substrate so as to pre-stress the substrate elastically against the heat sink by means of the hood and the pressing die at least when the power semiconductor module is fastened on the heat sink. The frame accommodates the substrate in an interlocking manner and/or is fastened to the substrate.

20 Claims, 2 Drawing Sheets

(51) Int. Cl.
*H01L 23/373* (2006.01)
*H01L 23/40* (2006.01)

(52) U.S. Cl.
CPC ............... *H01L 2224/48091* (2013.01); *H01L 2224/48227* (2013.01); *H01L 2224/48472* (2013.01)

(58) Field of Classification Search
USPC .......................... 257/691, 706, 707, 718, 719
See application file for complete search history.

(56) References Cited

U.S. PATENT DOCUMENTS

| | | | | |
|---|---|---|---|---|
| 2010/0127371 | A1* | 5/2010 | Tschirbs | H01L 23/13 257/684 |
| 2015/0102479 | A1* | 4/2015 | Fuergut | H01L 21/4871 257/706 |
| 2016/0315022 | A1* | 10/2016 | Egusa | H01L 23/053 |
| 2016/0372399 | A1* | 12/2016 | Fuergut | H01L 21/4871 |

\* cited by examiner

POWER SEMICONDUCTOR MODULE HAVING A TWO-PART HOUSING

PRIORITY CLAIM

This application claims priority to German Patent Application No. 10 2015 115 122.7 filed on 9 Sep. 2015, the content of said application incorporated herein by reference in its entirety.

TECHNICAL FIELD

The invention describes a power semiconductor module having active and/or passive components, in particular a power converter module.

BACKGROUND

Modern power semiconductor modules, which are the starting point of this invention, are modules without a base plate. In line with the generic type, said modules have a housing, a ceramic substrate with metal laminations which are designed to match the circuitry and are arranged on said substrate, as are produced, for example, in accordance with the DCB (direct copper bonding) process; components, such as diodes, transistors, resistors or sensors for example, and also bonding connections for connecting the structured side of the chip-like, unenclosed power semiconductor components to further components and/or to the substrate and/or to connection elements, which lead to the outside, which components are fitted on said substrate in a cohesive manner by means of soldering.

Furthermore, an encapsulation compound comprising silicone rubber is preferably provided in order to insulate the individual components from one another.

Heat transfer between the substrate and the heat sink is a key variable for power semiconductor modules which directly determines the performance of said power semiconductor modules. The heat which is produced in the power semiconductor components during operation therefore has to be dissipated as efficiently as possible.

It has been found that, in particular, solder connections, of large surface area, to a heat sink can be controlled in respect of quality only with great difficulty, this having an adverse effect on the reliability and also the service life of the power semiconductor modules. Therefore, the assembly technology with pressure contact for thermally conductive connection of the module to a heat sink has proven highly advantageous for power semiconductor modules of this kind.

DE 10 2004 051 039 A1 discloses a power semiconductor module of which the cover serves firstly to introduce pressure and also to exert pressure onto the bonding feet of the wire bonding connections of the power semiconductor components. Said document further describes and shows prior art in which the housing cover forms dies with which the substrate is pressed against the heat sink. In this case, it is very difficult to adjust the introduction of pressure and the substrate may be damaged or the contact-connection is not established in a reliable manner.

A further objective is to provide a module which can be supplied in a substantially preassembled state and as far as possible only needs to be fitted on a heat sink without other preassembly steps at the intended fitting location.

There is therefore a need for a power semiconductor module with improved assembly, which is due to simplified assembly, together with efficient heat transfer from the power semiconductor component to the heat sink.

SUMMARY

A power semiconductor module with improved assembly, which is due to simplified assembly, together with efficient heat transfer from the power semiconductor component to the heat sink, is provided. Features which are described individually in the claims can be combined with one another in any desired, technologically appropriate way and indicate further refinements of the invention. The description, in particular in conjunction with the figures, additionally characterizes and specifies the invention.

The invention relates to a power semiconductor module which is to be arranged on a heat sink. The module has at least one substrate. The substrate has a first side which is intended to be arranged to face the heat sink and to be thermally conductively connected to the heat sink. The substrate is preferably a ceramic substrate, preferably a substrate which is composed of $Al_2O_3$, AlN, $Si_3N_4$.

The substrate is laminated, for example, with a metal layer, for example which is composed of copper. The entire surface of the first side is preferably covered by the metal layer.

The power semiconductor module according to the invention comprises at least one power semiconductor component, preferably a power semiconductor component without a housing, which is arranged on a second side of the substrate, which second side is situated opposite the first side. The power semiconductor component is, for example, a semiconductor switch, such as an IGBT, MOSFET or a diode or combinations of these. A plurality of, for example two or three, power semiconductor components are preferably provided.

The power semiconductor module according to the invention has an electrically insulating housing which defines a cavity in which the at least one substrate and the at least one power semiconductor component are accommodated.

Furthermore, an electrically insulating housing is provided according to the invention. The housing is at least partially produced from plastic, such as from a thermoplastic, thermosetting plastic, or a fiber-reinforced, preferably glass fiber-reinforced plastic. The housing is, for example, produced using a shaping process, such as an injection-molding process. The substrate and the at least one power semiconductor component are accommodated in the housing, with, if need be, one or more contact sections of load and/or control connections being arranged outside the housing for making electrical contact with the power semiconductor component. The housing is, for example, provided with apertures in order to arrange these load and/or control connections such that they pass through the apertures.

The housing preferably has a frame, which surrounds the at least one substrate in a frame-like manner, and a hood, which is to be fastened to the heat sink by way of fastening means. According to the invention, the hood has at least one pressing die which is intended to make contact with the substrate in order to pre-stress the substrate elastically against the heat sink by means of the hood and by means of the at least one pressing die when the power semiconductor module is fastened on the heat sink. The pressing die and the hood are preferably integrally formed. Owing to the elastic pre-stress, efficient heat transfer from the substrate to the heat sink is achieved and also, for example, ensured only when the module is finally assembled and fastened. The elastic pre-stress is pre-specified, for example, by the shaping and the material of the hood.

It is preferably provided that the hood is designed to span the frame, where said hood accommodates the frame in a force-fitting or at least interlocking manner for example. As a result, the substrate is protected by the hood. Furthermore, a refinement in which the frame is likewise secured to the heat sink by means of the hood only by fastening of the hood, without additional fastening means between the frame and the heat sink being required, is made possible in this way.

The power semiconductor module according to the invention is distinguished in that the frame is fastened to the at least one substrate, for example by an interlocking connection or force-fitting connection, and/or the substrate is accommodated in the frame in an interlocking manner. This provides a degree of preassembly which accelerates assembly per se but, at the same time, reduces the risk of mechanical damage to the substrate owing to the protective effect of the frame. By way of example, the relative orientation of a plurality of substrates on the heat sink by the frame, which comprises the plurality of substrates, is simplified since a plurality of substrates can be fastened by way of comparatively few fastening means in one fastening step.

It is preferably provided that the frame and the substrate are connected in a force-fitting manner. The frame is, for example, adhesively bonded to the substrate.

According to a preferred refinement, the pressing die is fastened to the hood in an elastically flexible manner.

In order to create an effective elastic pre-stress, the pressing die is oversized in relation to the associated clear distance between the hood and the substrate.

According to a preferred refinement, it is provided that the hood is supported on the frame in the pre-stressing direction of the pressing die by one or more projecting supports. These supports are, for example, integrally formed with the frame or the hood. In one embodiment, the design and the positioning of the supports has the result, for example, that the pre-stressing force of the pressing die is restricted to a maximum force when fastening of the hood is complete. According to a preferred refinement, the design and positioning of the supports ensure that, when the hood is not fastened, the pressing die bears at most loosely on the substrate and, after the hood is fastened to the heat sink, only establishes the pre-stress, which is created by the pressing die, by elastic deformation of the hood owing to said hood being bent by means of the stop or stops as bending edge.

At least one material weakening is preferably provided in the hood in order to mount the pressing die on said hood in an elastically flexible manner. Within the meaning of the invention, material weakening means a reduction in the material strength, for example due to a recess or a slot in a housing wall. The slot can be linear, zigzag-shaped or in the form of a curved line. The material weakening is, for example, provided in a region which immediately surrounds the projection of the pressing die. The expression 'which immediately surrounds' means, for example, a spacing of less than 2 cm, preferably of less than 1 cm, between the material weakening and the central axis of the pressing die.

According to a preferred refinement, the hood has two passage slots, which run tangentially in relation to a pressing die projection, in each case in the region which surrounds the pressing die. A pressing die projection is intended to be understood to mean the transition region between the hood and the pressing die when the pressing die and the hood are of integral design. As a result, a bending bar is provided by the material of the hood. The passage slots preferably extend parallel to one another.

The hood preferably has in each case one bore, for being fastened to the heat sink, on two opposite sides.

The passage slots preferably run parallel to an imaginary line which connects the axis of the bores.

A releasable connection is preferably provided between the hood and the frame.

The hood and the frame can preferably be connected in a force-fitting, e.g. friction-fitting, manner. By way of example, the friction-fitting connection is formed by friction lugs which are formed by the material of the hood and/or the material of the frame.

According to a further preferred refinement of the power semiconductor module according to the invention, the frame bears against the second side of the substrate and is therefore placed over the substrate or substrates.

The invention further relates to the arrangement comprising a heat sink and a power semiconductor module, which is fastened to said heat sink, in one of the embodiments described above. The power semiconductor module is preferably a so-called module without a base plate, that is to say the at least one substrate is arranged so as to immediately adjoin the heat sink, possibly by means of a metal lamination.

Those skilled in the art will recognize additional features and advantages upon reading the following detailed description, and upon viewing the accompanying drawings.

BRIEF DESCRIPTION OF THE DRAWINGS

The invention will be explained in greater detail with reference to the following figures. In this case, the figures are intended to be understood merely in an exemplary manner and constitute only a preferred design variant. In the drawing.

DETAILED DESCRIPTION

Figure 1:
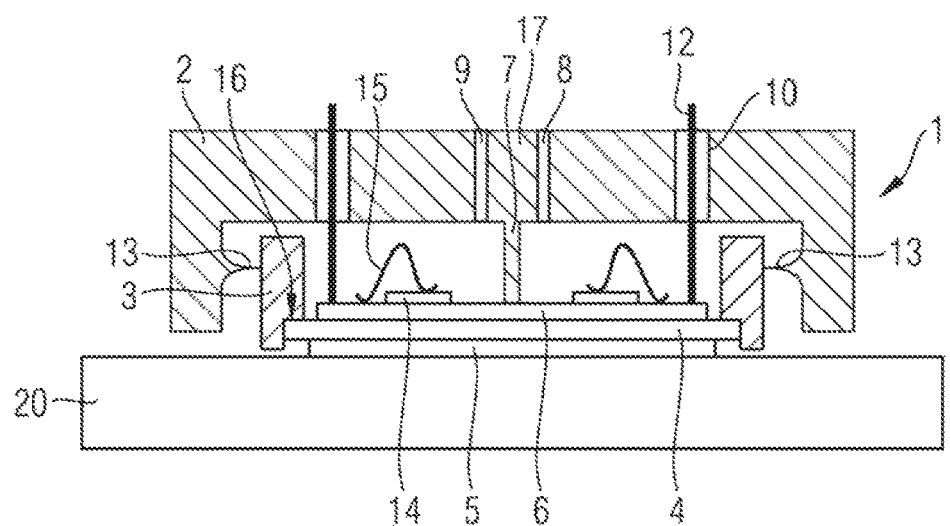
FIG. 1 shows a schematic sectional view through one embodiment of a power semiconductor module.

FIG. 1 illustrates a power semiconductor module 1 intended to be arranged in a fastened manner on a heat sink 20. The power semiconductor module 1 has a two-part housing 2, 3. A substrate 4, which is laminated 5, 6 with copper on both sides, is arranged in the hollow volume, which is defined by the housing 2, 3, as the housing interior. The housing comprises a frame 3 and a hood 2 which spans the frame 3.

The lamination 5 of the substrate 4, which lamination is intended to be arranged on the heat sink 20 so as to adjoin it, is formed virtually over the entire surface area and serves to establish a thermally conductive connection between the substrate 4 and the heat sink 20. That side of the substrate 4 which faces the housing interior is likewise laminated with metal, where this lamination 6, inter alia, in the form of conductor tracks for making electrical and/or thermally conductive contact has power semiconductor components 14 which are arranged on the substrate 4 and are soldered to the lamination 6. Furthermore, bonding wires 15 are provided for making electrical contact with the power semiconductor components 14. The load connections and/or control connections 12 for the power semiconductor components 14 are led out of the housing interior to the outside via apertures 10 in the hood 2, in order to provide contact sections outside the housing 2, 3.

Furthermore, the frame 3 has a contact area 16 which is set back in the direction of the housing interior and by way of which the frame 3 bears against that side of the substrate 4 which is fitted with the power semiconductor components 14. The frame 3 is fastened to the substrate 4 by means of an adhesive layer which is provided in the region of the contact area 16. The hood 2, which is designed such that it spans the frame 3, has one or more ribs 13 on its inner side which faces the frame 3 in order to connect the frame 3 to the hood 2 in a friction-fitting manner. The hood 2 has a centrally arranged pressing die 7 which, by way of its free end, bears against the substrate or the upper lamination 6 and, when the hood 2 is fastened by fastening means, not illustrated in FIG. 1, elastically pre-stresses the substrate 4 against the heat sink 20 since the pressing die 7 is oversized in comparison to the clear distance between the hood 2 and the substrate 4. The pressing die 7 is integrally formed with the hood 2 from a thermoplastic. Two passage slots 8, 9 which run in parallel and which run tangentially in relation to a projection region 17 of the pressing die 7 are provided in order to provide the pressing die 7 with a degree of elastic flexibility. The material weakening in the hood 2, which material weakening is provided by means of the passage slots 8, 9, forms a bending bar which provides a degree of elastic flexibility for the pressing die 7, said degree of elastic flexibility being greater than that of a hood, not illustrated, which is not weakened but otherwise has the same dimensions and material composition.

Figure 2:
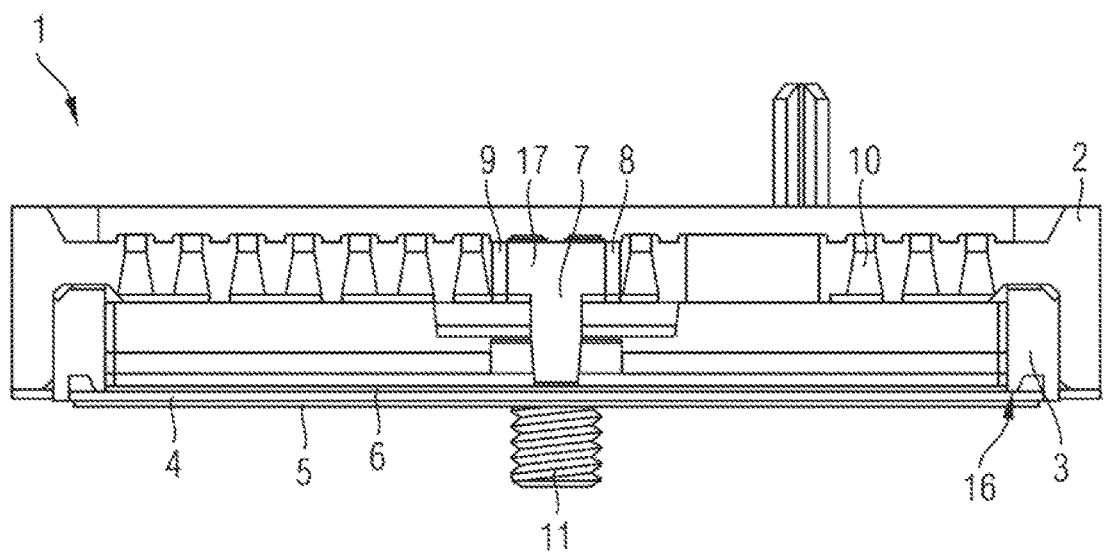
FIG. 2 shows a cross-sectional view through a further embodiment of a power semiconductor module.
Figure 3:
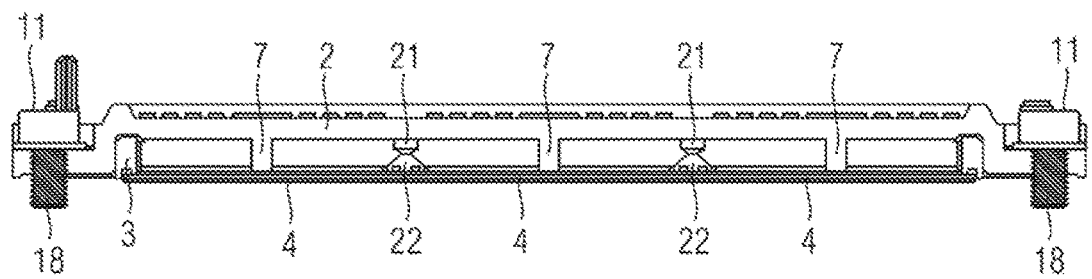
FIG. 3 shows a longitudinal sectional view of the power semiconductor module of FIG. 2.
Figure 4:
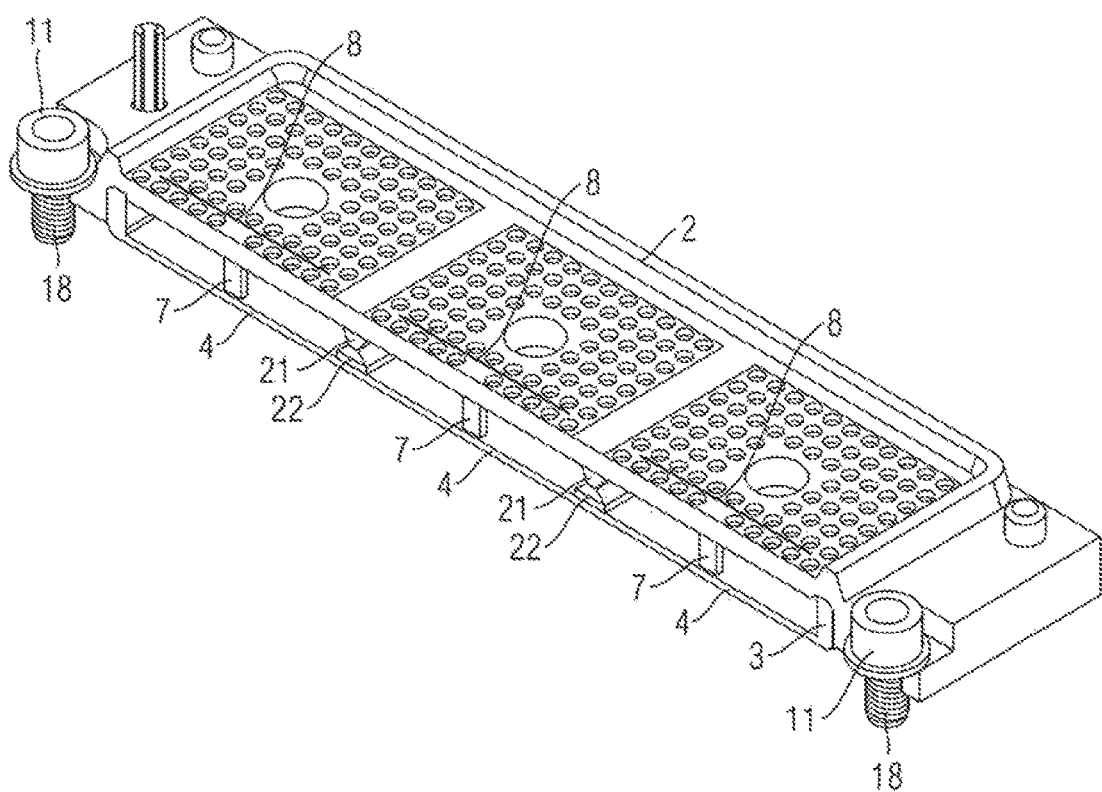
FIG. 4 shows a perspective longitudinal sectional view of the power semiconductor module of FIG. 2.

FIGS. 2 to 4 show a further embodiment of a power semiconductor module 1 according to the invention, where a plurality of substrates 4 are arranged in a module housing 2, 3 comprising a frame 3 and a hood 2. The frame 3 is arranged in the hood 2, which spans the frame 3, in an interlocking manner. In contrast to the above-described embodiment, the frame 3 bears against that side of the substrate 4 which faces the housing interior by means of a set-back bearing lug 16. Said figures further show the screws 11 as fastening means, said screws passing through terminal diametrically opposite bores in the hood 2 in order to fasten the hood 2 to a heat sink, not illustrated, where the plurality of pressing dies 7, on account of their oversize, each pre-stress a substrate 4 against the heat sink, not illustrated. As is clear from FIGS. 2 to 4, the passage slots 8 and 9 extend parallel to one another and to an imaginary line which connects the axis of the bores 18. Furthermore, a plurality of supports 21, 22 which interact in pairs and are formed by the frame 3 and, respectively, the hood 2 are provided, said supports being positioned and designed such that, when the hood 2 is not fastened to the heat sink, the pressing dies 7 of said hood 2 bear loosely on the substrates 4, while the elastic pre-stress which is created by the pressing dies 7 and therefore the efficient heat transfer between the substrates 4 and the heat sink are established only when the hood 2 is fastened to the heat sink by means of the screws 11.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module for being arranged on a heat sink, the power semiconductor module comprising:
   a substrate having a first side for being arranged to face the heat sink and for being thermally conductively connected to the heat sink;
   a power semiconductor component arranged on a second side of the substrate opposite the first side; and
   an electrically insulating housing which defines a cavity in which the substrate and the power semiconductor component are accommodated,
   wherein the housing comprises a frame which surrounds the substrate in a frame-like manner, and a hood for being fastened to the heat sink by way of fastening means,
   wherein the hood comprises a pressing die for making contact with the substrate so as to pre-stress the substrate elastically against the heat sink by means of the hood and by means of the pressing die at least when the power semiconductor module is fastened on the heat sink,
   wherein the frame accommodates the substrate in an interlocking manner and/or is fastened to the substrate.

2. The power semiconductor module of claim 1, wherein the frame and the substrate are connected in a force-fitting manner.

3. The power semiconductor module of claim 1, wherein the pressing die is fastened to the hood in an elastically flexible manner.

4. The power semiconductor module of claim 1, wherein the hood is supported on the frame in a pre-stressing direction of the pressing die by one or more projecting supports.

5. The power semiconductor module of claim 1, further comprising at least one material weakening disposed in the hood so as to mount the pressing die on the hood in an elastically flexible manner.

6. The power semiconductor module of claim 1, wherein the hood and the pressing die are integrally connected by means of a pressing die projection, and wherein the hood has two passage slots which run tangentially in relation to the pressing die projection, in each case in a region which surrounds the pressing die.

7. The power semiconductor module of claim 1, wherein the hood comprises a bore for being fastened to the heat sink on two opposite sides.

8. The power semiconductor module of claim 7, further comprising passage slots which extend parallel to one another.

9. The power semiconductor module of claim 8, wherein the passage slots extend parallel to an imaginary line which connects the bores.

10. The power semiconductor module of claim 1, wherein the hood and the frame are configured to be connected in an interlocking or force-fitting manner.

11. The power semiconductor module of claim 10, wherein the hood and the frame are configured to be connected in a friction-fitting manner.

12. The power semiconductor module of claim 1, wherein the frame bears against the second side of the substrate.

13. An arrangement, comprising:
a heat sink; and
a power semiconductor module fastened to the heat sink, the power semiconductor module comprising:
a substrate having a first side facing the heat sink and thermally conductively connected to the heat sink;
a power semiconductor component arranged on a second side of the substrate opposite the first side; and
an electrically insulating housing which defines a cavity in which the substrate and the power semiconductor component are accommodated,
wherein the housing comprises a frame which surrounds the substrate in a frame-like manner, and a hood fastened to the heat sink by way of fastening means,
wherein the hood comprises a pressing die which contacts the substrate and pre-stresses the substrate elastically against the heat sink by means of the hood and by means of the pressing die,
wherein the frame accommodates the substrate in an interlocking manner and/or is fastened to the substrate.

14. The arrangement of claim 13, wherein the pressing die is fastened to the hood in an elastically flexible manner.

15. The arrangement of claim 13, further comprising at least one material weakening disposed in the hood so as to mount the pressing die on the hood in an elastically flexible manner.

16. The arrangement of claim 13, wherein the hood and the pressing die are integrally connected by means of a pressing die projection, and wherein the hood has two passage slots which run tangentially in relation to the pressing die projection, in each case in a region which surrounds the pressing die.

17. The arrangement of claim 13, wherein the hood comprises a bore fastened to the heat sink on two opposite sides.

18. The arrangement of claim 17, further comprising passage slots which extend parallel to one another.

19. The arrangement of claim 18, wherein the passage slots extend parallel to an imaginary line which connects the bores.

20. The arrangement of claim 13, wherein the frame bears against the second side of the substrate.

* * * * *